(12) United States Patent
Emoto

(10) Patent No.: US 6,954,258 B2
(45) Date of Patent: Oct. 11, 2005

(54) POSITIONING APPARATUS

(75) Inventor: Keiji Emoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 155 days.

(21) Appl. No.: 10/207,800

(22) Filed: Jul. 31, 2002

(65) Prior Publication Data

US 2003/0035088 A1 Feb. 20, 2003

(30) Foreign Application Priority Data

Aug. 20, 2001 (JP) ........................................ 2001-248977

(51) Int. Cl.$^7$ .......................... G03B 27/58; G03B 27/52
(52) U.S. Cl. .......................................... 355/72; 355/30
(58) Field of Search ........................ 355/30, 53, 72–76; 310/10, 12; 318/628

(56) References Cited

U.S. PATENT DOCUMENTS

| | | | |
|---|---|---|---|
| 3,171,956 A | | 3/1965 | Coleman et al. ........... 250/49.5 |
| 5,231,291 A | * | 7/1993 | Amemiya et al. ......... 250/443.1 |
| 6,226,073 B1 | | 5/2001 | Emoto .......................... 355/53 |
| 6,509,951 B2 | * | 1/2003 | Loopstra et al. .............. 355/30 |
| 6,714,278 B2 | * | 3/2004 | Kamiya ........................ 355/30 |
| 2001/0055102 A1 | | 12/2001 | Emoto .......................... 355/53 |
| 2002/0027644 A1 | | 3/2002 | Bisschops .................... 355/30 |
| 2002/0079461 A1 | | 6/2002 | Kirschstein et al. ... 250/442.11 |

FOREIGN PATENT DOCUMENTS

| | | |
|---|---|---|
| EP | 1 124 161 A2 | 8/2001 |
| EP | 1 189 018 A2 | 3/2002 |
| JP | 61-189637 | 8/1986 |
| JP | 7-216550 | 8/1995 |
| JP | 9-92613 | 4/1997 |
| JP | 9092613 | * 4/1997 |
| JP | 11-251400 | 9/1999 |

OTHER PUBLICATIONS

European Search Report dated Dec. 21, 2004, issued in corresponding European patent appln. No. 02 25 5684, forwarded in a Communication dated Dec. 29, 2004.

* cited by examiner

*Primary Examiner*—Henry Hung Nguyen
(74) *Attorney, Agent, or Firm*—Fitzpatrick, Cella, Harper & Scinto

(57) ABSTRACT

A positioning apparatus for performing position of a target object in a vacuum atmosphere. The apparatus includes a first structure, a second structure which is movable relative to the first structure and supports the target object, a radiation plate, which is arranged on the first structure, performing heat exchange between the radiation plate and the second temperature by utilizing radiation, and a temperature adjusting device for adjusting of a temperature of the radiation plate. The temperature adjusting device adjusts the temperature of the radiation plate to control a temperature of the second structure or the target object.

17 Claims, 12 Drawing Sheets

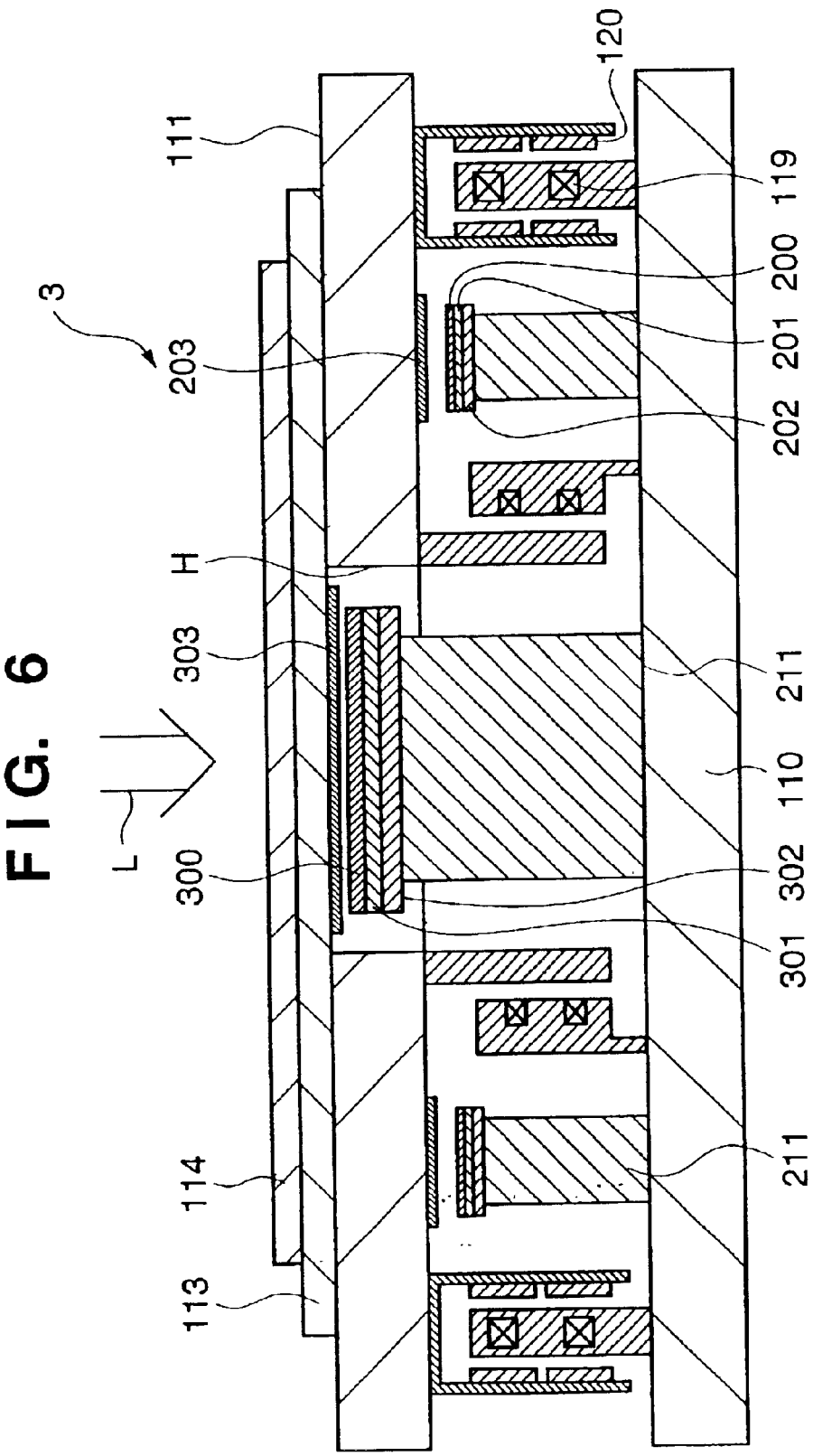

FIG. 10

```
URL  http://www.maintain.co.jp/db/input.html

TROUBLE DB INPUT SCREEN

DATE         2000/3/15  ~1404
MODEL        * * * * * * * * *  ~1401
TITLE        OPERATION ERROR (STARTUP ERROR)  ~1403
MACHINE S/N  465NS4580001  ~1402
URGENCY LEVEL  D    ~1405
SYMPTOM      LED KEEPS BLINKING
             AFTER POWER IS TURNED ON        ~1406

TROUBLE      TURN ON POWER AGAIN (PRESS RED
SHOOTING     BUTTON WHEN STARTING UP THE MACHINE)  ~1407
METHOD

FOLLOW-UP    PROBLEM PROVISIONALLY SOLVED    ~1408

[SEND] [RESET]         1410              1411            1412
              LINK TO DATABASE OF RESULT LIST  SOFTWARE LIBRARY  OPERATION GUIDE
```

POSITIONING APPARATUS

FIELD OF THE INVENTION

The present invention relates to a positioning apparatus for performing positioning of a target object in a vacuum atmosphere, which is preferably employed by an exposure apparatus for transferring a pattern of an original plate onto a substrate, or a device manufacturing method employing the exposure apparatus, or the like.

BACKGROUND OF THE INVENTION

In order to achieve a highly accurate positioning, it is necessary for a positioning apparatus to enhance a vibration isolation characteristic of a positioning-target object. To isolate vibrations from an external portion, the positioning-target object is supported by an extremely weak spring element and driven by a lorentz force. Employing a weak spring element makes it possible to virtually disregard the spring property, and employing the Lorentz force cuts off transmission of a vibration between a stationary member and a movable member and isolates the vibration from an external portion.

For empty-weight supporting means having a spring element, for instance, a mechanical spring, a permanent magnet, or an electromagnet, or the like, may be used. For driving means employing a Lorentz force, a linear motor, or the like, may be used. As a result of the attempt to enhance the vibration isolation characteristic of the positioning-target object, the positioning-target object will have a structure that has virtually no physical contact with an external portion, in some cases, a non-contact structure.

Heat enters or exits by thermal conduction, convection, or radiation. However, in a vacuum atmosphere, entrance or exit of heat by convection does not occur. Furthermore, as mentioned above, as a result of the attempt to enhance the vibration isolation characteristic of the positioning-target object, the positioning-target object has a structure that has virtually no physical contact with an external portion. Therefore, the amount of thermal conduction is very limited.

In other words, when a vibration isolation characteristic of a positioning-target object is to be enhanced in a vacuum atmosphere, since the amount of heat of the positioning-target object is not emitted externally by thermal conduction or convection, the amount of heat is accumulated in the positioning-target object. In such a case, even if the amount of inflowing heat [W] is small, because it is extremely hard for the heat to escape externally, the amount of heat [J] gradually accumulates, and the temperature of the member gradually rises.

Particularly, in a case of an exposure apparatus, the amount of heat, e.g., exposure heat, chuck heat (in a case of using an electrostatic chuck), and so on, flows into a substrate and its accompanying members when exposure is performed. As the amount of heat accumulates, the temperature of the members, such as the substrate, or the like, rises.

In general, a precision instrument dislikes a temperature rise of members. Taking an exposure apparatus as an example, the temperature rise causes various detrimental effects, such as poor exposure accuracy caused by thermal deformation of a substrate subjected to positioning, or poor positioning accuracy caused by a change in a measurement reference resulting from thermal deformation of a top plate supporting the substrate, and so on.

A refrigerant pipe may be provided to the positioning-target object to realize heat recovery using a refrigerant. However, a refrigerant pipe can become a vibration transmission factor that transmits an external vibration to the positioning-target object through the refrigerant pipe, or can become a source of a vibration caused by a refrigerant flowing through the pipe or a force disturbance induction due to deformation of the pipe at the time of driving. Therefore, providing a refrigerant pipe is not preferable from the standpoint of the primary object of a positioning apparatus (vibration isolation of a positioning-target object). Furthermore, if a sensor for measuring a temperature is directly pasted on the positioning-target object, the outgoing line of the sensor deteriorates the vibration characteristic, similar to the refrigerant pipe.

Accordingly, it has been an issue how to prevent the temperature rise of the positioning-target object by recovering the heat flowing to the apparatus in a vacuum atmosphere, while ensuring the vibration characteristic (vibration isolation characteristic), that is, the positioning characteristic.

SUMMARY OF THE INVENTION

The present invention has been proposed in view of the above problem, and has as its object to provide a positioning apparatus, which has a high vibration isolation characteristic from an external portion in a vacuum atmosphere and enables temperature control of a positioning-target object while maintaining the vibration isolation characteristic.

According to the present invention, the foregoing object is attained by providing a positioning apparatus for performing positioning of a target object in a vacuum atmosphere, comprising:

a first structure, a second structure which is movable relative to said first structure and supports the target object; and a heat exchange portion performing heat exchange between said first structure and said second structure by utilizing radiation.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 6 is a view showing a construction of a main part of a positioning apparatus according to a third embodiment of the present invention;

FIG. 10 is a concrete example of a user interface;

DETAILED DESCRIPTION OF THE PREFERRED EMBODIMENTS

Preferred embodiments of the present invention will now be described in detail in accordance with the accompanying drawings.

<First Embodiment>

Figure 1:
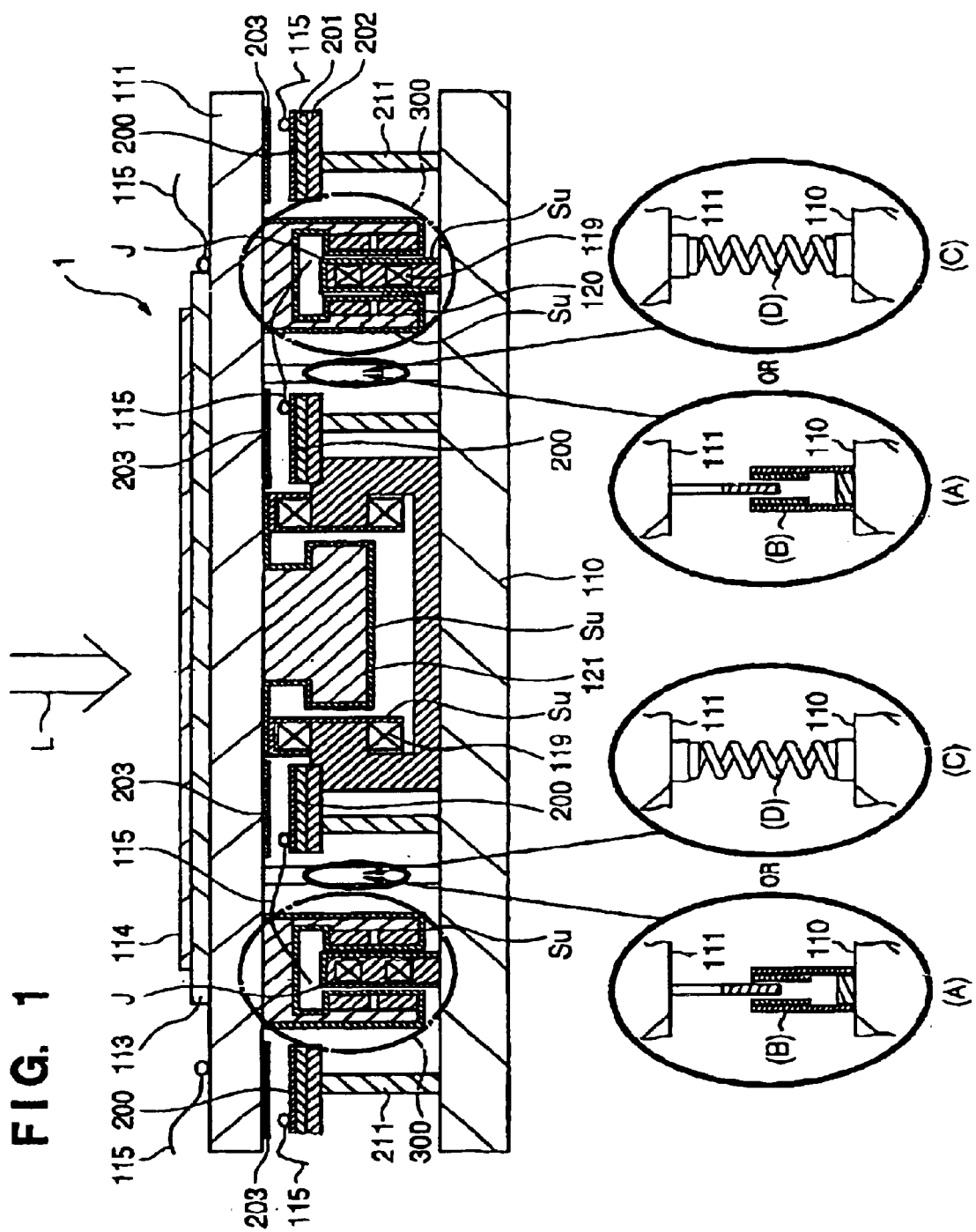
FIG. 1 is a view showing a construction of a main part of a positioning apparatus according to a first embodiment of the present invention.

FIG. 1 is a view showing a construction of a positioning apparatus according to the first embodiment of the present invention.

The positioning apparatus 1 comprises: a bottom plate 110 as the first structure, a top plate 111 as the second structure, which is movable relative to the bottom plate 110, and a heat exchange portion which exchanges heat between the bottom plate 110 and top plate 111 by utilizing radiation. The heat exchange portion is constructed with a radiation plate 200 arranged on a supporting member 211 that is fixed to the bottom plate 110 and a black body 203 arranged on the back surface of the top plate 111.

In the case of this embodiment positioning-target objects are the substrate 114, electrostatic chuck 113, and top plate 111, as well as its accompanying members. The electrostatic chuck 113 and substrate 114 are placed on the top plate 111. The top plate 111 and bottom plate 110 are made of ceramics. Only one of them may be made of ceramics. A temperature sensor 115, which constitutes the temperature measurement unit, is provided on the top plate 111, the side surface of, the electrostatic chuck 113, and each of a plurality of radiation plates 200.

Figure 2:
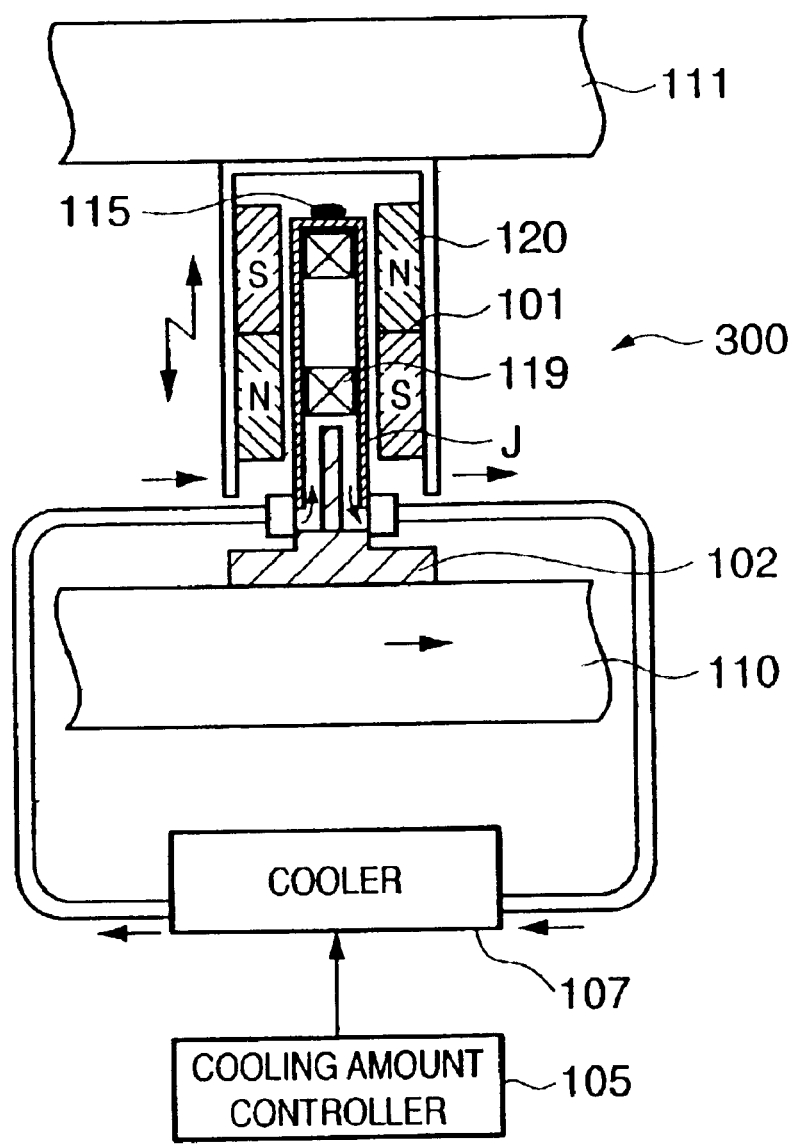
FIG. 2 is a detailed view of a linear motor driven for performing positioning in the positioning apparatus according to the first embodiment of the present invention.

The positioning apparatus 1 employs one (or two depending on the structure) linear motor (not shown) in the X direction, two linear motors (or one depending on the structure). (not shown), in the Y direction, and three linear motors 300 in the Z direction (two of them are shown in FIG. 1), with a total of six or more linear motors in a vacuum atmosphere. The detailed construction of the linear motor, serving as a driving device for driving a positioning-target object, is shown in FIG. 2. The linear motor 300, comprising a movable member 101 and a stationary member 102, performs driving for fine-adjusting the positioning of a positioning-target object in six degrees of freedom with respect to each of the X, Y, and Z directions, as well as the rotational directions of the X, Y, and Z axes. Utilizing the Lorentz force in positioning enables vibration isolation of the positioning-target object, e.g., top plate 111, or the like, from the external portion.

A coil 119 of the linear motor 300 provided on the stationary member side is covered with a jacket J. Since a temperature-controlled refrigerant supplied from a cooler 107 flows in the jacket J, the amount of heat of the coil 119 is recovered by the cooler 107 of the driving device external portion. By virtue of this heat recovery, the top plate 111 can be prevented from a temperature rise caused by heat of the coil 119 being transmitted to the top plate 111 through the air or a member. The cooling intensity of the cooler 107 is controlled by a cooling amount controller 105. Each linear motor 300 is of a movable magnet type, and the coil 119 that produces heat is placed on the bottom plate 110 side, so that there is no heating factor on the top plate 111 side. For, this reason, the movable member 101, including a magnet 120, is provided to the top plate 111, and the stationary member 102 is provided to the bottom plate 110.

The positioning apparatus 1 comprises an empty weight compensation mechanism as a supporting apparatus which receives an empty weight at the top plate 111 and its accompanying members (including substrate 114). According to the empty weight compensation mechanism, the bottom plate 10 supports the top plate 11 without contact by virtue of a magnetic repulsion produced by a combination of an electromagnet (not shown) provided on the bottom plate 110 (first structure) and a magnet (not shown) provided on the top plate 111 (second structure). In the empty weight compensation mechanism, a magnetic flux feedback is applied to the electromagnet to control the magnetic force, thereby keeping the spring element extremely small so that vibration of the bottom plate 110 does not influence the top plate 111. Note that as the spring element, a mechanical spring, or the like, may be utilized, besides the combination of the permanent magnet and the electromagnet.

The bottom plate 110 and a coarse-adjustment stage (not shown) are tightly connected. Furthermore, a central core 121 and coil 119 constitute an electromagnetic joint between the bottom plate 110 and top plate 111. The electromagnetic joint is controlled such that a force is transmitted from the bottom plate 10 to the top plate 111 when the coarse-adjustment stage (not shown) is accelerated or decelerated. With the help of the electromagnetic joint, the positioning apparatus 1 supplements the large force necessary to accelerate or decelerate the coarse adjustment stage, thereby minimizing the heat of the linear motor 300 utilizing the inefficient Lorentz force.

The substrate 114, which is the positioning-target object, as well as the chuck 113 and top plate 111, which are the supporting member of the substrate 114, are physically connected to the bottom plate 110 and an external portion (e.g., a surface plate supporting the bottom plate, a structure constructing the exposure apparatus, and so forth) only with a small electric wiring, such as a sensor, or the like.

As exposure operation is performed, heat is produced from the substrate 114 and electrostatic chuck 113 due to an exposure light L. However, because of the above-described configuration, the amount of heat transferred to peripheral gas or liquid, or transferred by thermal conduction through a solid object is small enough to be disregarded. As a result, the temperature of the positioning-target objects, such as the substrate 114, chuck 113, top plate 111, and so forth, gradually rises.

As a measure to the temperature rise, according to this embodiment, the temperature of the radiation plate 200 is set low, e.g., 0 to 10° C., depending on the necessary amount of heat transfer. Since the temperature of the radiation plate 200 is low, heat of the positioning-target objects, such as the top plate 111, transfers from the backside of the top plate 11 to the bottom plate 110 through the radiation plate 200 due to radiation. Accordingly, it is possible to dissipate the amount of heat flowing to the substrate 114, chuck 113, and top plate 111, or the like, through the radiation plate 200 without contact, thus preventing a temperature rise in these members. Furthermore, the radiation plate 200 has plural radiation areas with appropriate spacing. Accordingly, a partial temperature difference due to the temperature distribution of the top plate 111 can be minimized.

Figure 3:
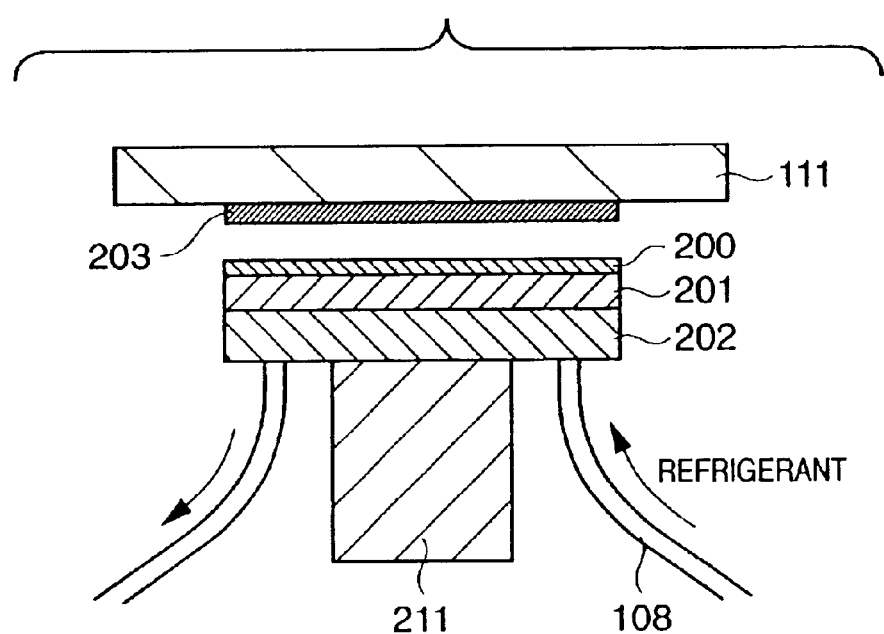
FIG. 3 is a detailed view of a radiation portion of FIG. 2.

FIG. 3 is a detailed view of the heat exchange portion including the radiation plate 200, and the neighboring portion.

Reference numeral 200 denotes a radiation place provided on the bottom plate 110 side. The surface of the radiation plate 200 opposed to the top plate 111 is the black body 203. Reference numeral 201 denotes a Peltier element provided on the back surface of the radiation plate 200. Reference numeral 202 denotes a cooling plate provided on the heat exhaust side of the Peltier element 201. The cooling plate 202 exchanges heat with a temperature-controlled refrigerant sent through a pipe 108. Reference numeral 211 denotes a supporting member for fixing the radiation plate 200, Peltier element 201, and cooling plate 202 to the bottom plate 110. The black body 203, provided on the top plate 111, faces the radiation plate 200.

In order to perform efficient heat exchange by radiation, the black body 203 is formed with a material having a high emissivity (about 0.8 to 1). Although a resin material has a high emissivity, in general, the first embodiment employs a particularly little-degassing resin as the black body, taking the usage in a vacuum atmosphere into consideration. Examples of a little-degassing resin are: polyimide resin, PEEK resin, fluorocarbon resin, silicone resin, and the like. The black body 203 is formed by pasting this resin on the surface of the radiation plate 200 or top plate 111. Note that fluorocarbon resin and silicone resin can be made to have an adhesiveness and coated on the surface as a black body coating material to be set in.

Furthermore, to prevent the black body 203 from degassing due to adhesion, a resin film may be formed on the surface by deposition. Moreover, the black body 203 may be made of a material other than an organic matter such as resin. For instance, glass, or copper or steel having a thick layer of oxides may be used as a black body. Resin has a high emissivity, but also has a large degassing characteristic. On the contrary, glass, or metal having a thick layer of oxides has a low emissivity, but has a small degassing characteristic compared to resin. Therefore, it is desirable to select a material of the black body 203, in accordance with the circumstances. Note that the radiation plate 200 may be formed with a black body material itself.

Since the circulation refrigerant circulating in the pipe 108 is provided on the bottom plate side, the refrigerant does not impose a negative vibration effect on the positioning-target object. Herein, the amount of electrification to the Peltier element 201 is adjusted such that just the right amount of heat is recovered from the temperature-control targets (substrate 114, chuck 113 supporting the substrate, and top plate 111 supporting the above members, as well as temperature sensor 115). The adjustment of the amount of electrification is performed based on the outputs of the temperature sensor 115 provided to the radiation plate 200, temperature sensor 115 provided to the temperature-control targets, and the amount of heat flowing to the temperature-control targets (substrate 114, chuck 113, and top plate 111), which is calculated and estimated by a central control device that controls the entire apparatus, such as the exposure light L and positioning apparatus 1.

Furthermore, in order to minimize the amount of radiation heat that flows into the temperature-control targets (substrate 114, chuck 113, and top plate 111), the jacket surface Su covering the coil 119, which is the heat source, the core 121 opposed to the surface Su, and the magnet 120, as well as the surface Su portion peripheral to the magnet 120 are made of a material having a low emissivity of 0.1 or lower.

More specifically, the surface Su is nickel plated or aluminum foil is pasted thereon. The metal film of the surface Su is formed with a nonmagnetic material in order to reduce an influence on a magnetic circuit of the magnet or electromagnet. Moreover, the metal plate is made thin, 50 μm or smaller, to suppress negative influences on the positioning, which is caused by an eddy current that occurs in a case wherein a relative motion is generated between the jacket J and magnet 120.

Furthermore, for a structural member, such as the core 121, which originally has a low emissivity, the emissivity can be lowered further by polishing the surface. By virtue of the above construction, it is possible to minimize transmission of the heat, generated in the coil 119, to the temperature control targets (substrate 114, chuck 113, and top plate 111) by radiation.

Moreover, in order to minimize the heat transfer between the coil 119 and portions other than the heat source such as the coil 119, and to limit heat entrance and exit of the temperature-control targets (114, 113, 111) through the radiation plate 200 only, it is better to construct the entire surface of the temperature-control targets (114, 113, 111) with a low emissivity material, as much as possible, by, for instance, applying a metal film to their surfaces. By virtue of suppressing heat entrance and exit with an external portion, effects imposed on the members subjected to tight temperature control, e.g., an optical system, or the like, can be minimized.

<Second Embodiment>

Figure 4:
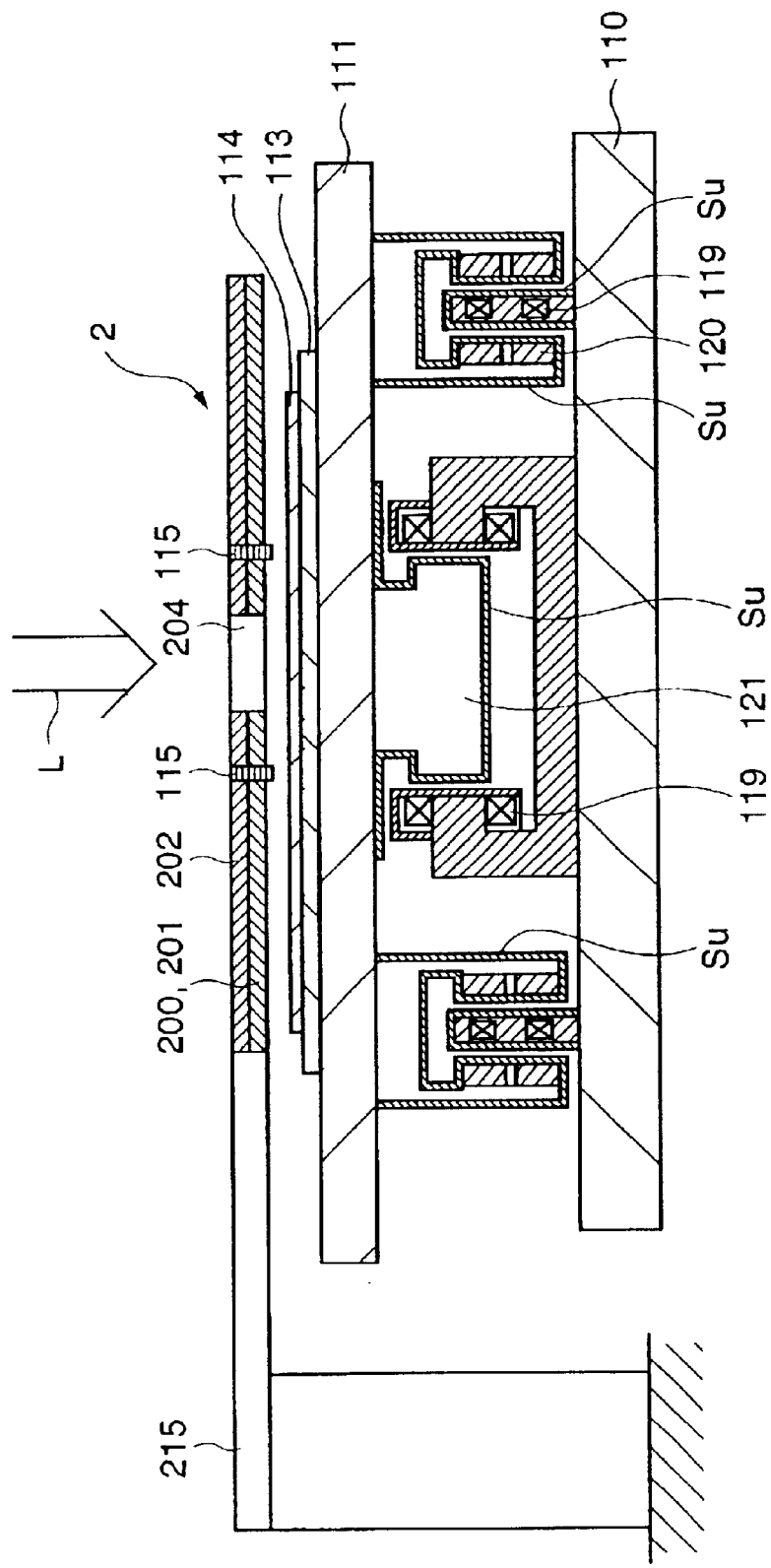
FIG. 4 is a view showing a construction of a main part of a positioning apparatus according to a second embodiment of the present invention.

An example of a positioning apparatus according to the second embodiment is shown in FIG. 4.

The positioning apparatus 2 recovers heat of the substrate 114 and, if necessary, the chuck 113, as well as top plate 111 serving as the supporting members, through the radiation plate 200, which is supported by an external structure 215. The basic positioning mechanism is the same as that of the first embodiment. The installation form of the radiation plate 200 and so forth that constitutes the heat exchange portion is different from that of the first embodiment. According to this embodiment, heat can be directly recovered from the substrate 114, which directly receives exposure heat and chuck heat. Therefore, highly precise temperature control of the substrate 114 is possible. The radiation plate 200 and structural members thereof have an exposure light through-hole 204 on the optical axis of the exposure light L so as not to obstruct the exposure light L. Further, the temperature sensor 115 using a radiation thermometer is provided to a part of the radiation plate 200. This is for measuring a temperature of the positioning-target objects (114, 113, 111) without contact, so as to prevent a vibration characteristic from being deteriorated by providing the temperature sensor 115 on the positioning-target objects (substrate 114, chuck 113, and top plate 111).

The radiation plate 200 is formed larger than the positioning-target objects, and is divided into appropriate areas. In accordance with the relative positional relation between the radiation plate 200 and substrate 114 a certain area of the radiation plate 200 only is set at a temperature that can expect the radiation effect and other areas of the radiation plate 200 are set at a temperature (e.g., room temperature) that does not affect others.

Figure 5A:
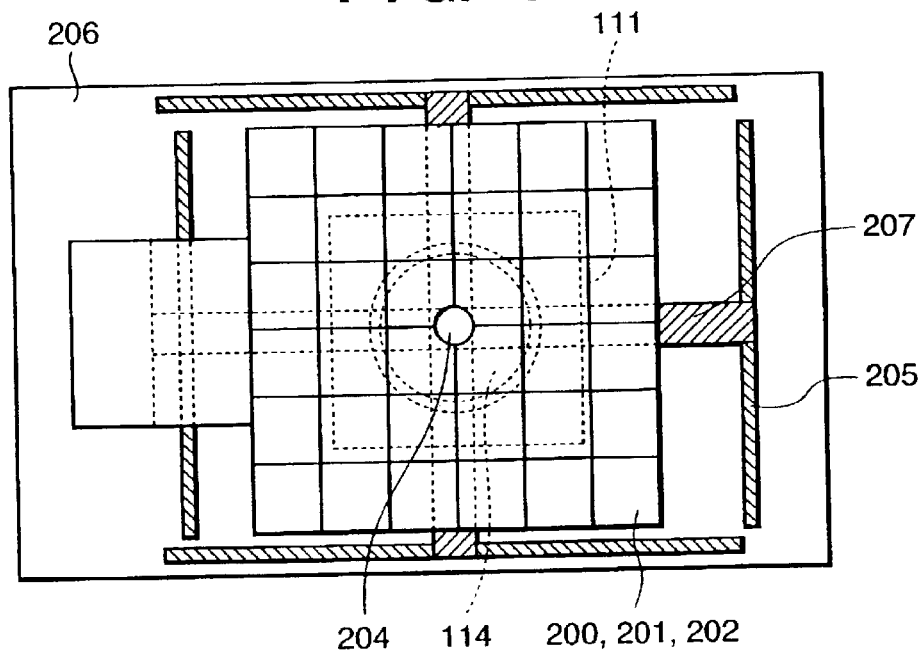
FIG. 5A is a plan view showing a construction of a radiation plate in a case where the embodiment shown in FIG. 4 is combined with a coarse-adjustment stage.
Figure 5B:
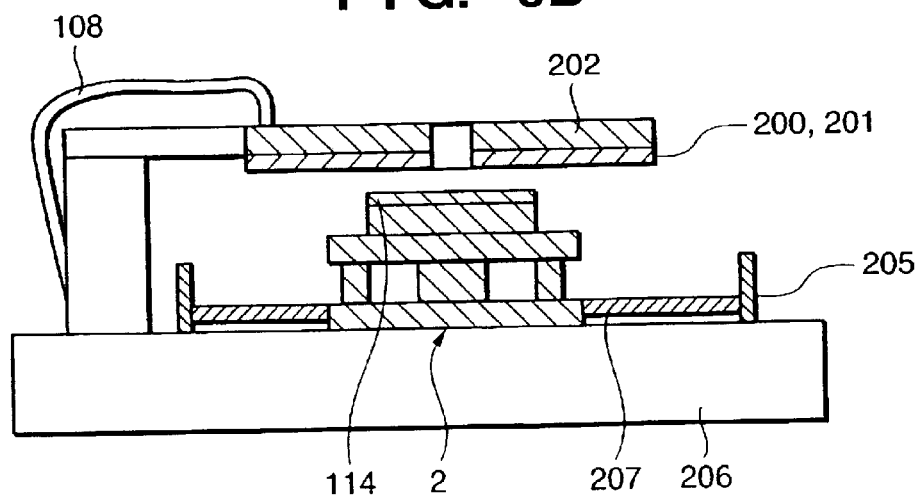
FIG. 5B is an elevation view showing a construction of a radiation plate in a case where the embodiment shown in FIG. 4 is combined with a coarse-adjustment stage.

By virtue of setting the temperature as described above, when the substrate 114 is moved in the plane surface direction by the positioning apparatus 2, heat transfer by radiation is precisely performed on the substrate 114, chuck 113, and top plate 111, and the influence of radiation is not imposed on other members. In the case of an example shown in FIGS. 5A and 5B, the radiation plate 200 is divided into 6×6 division areas. Each of the division areas of the radiation plate 200 is provided with the Peltier element 201, and the division areas have a common cooling plate 202.

Accordingly, the temperature of each area can independently be changed at liberty. Therefore, for instance, if the substrate 114 only is to be cooled, the temperature of the area of the radiation plate 200 opposed to the substrate 114 is decreased and areas of the radiation plate 200 which are not opposed to the substrate 114 are set to an approximate room temperature. Even if the relative position between the substrate 114 and radiation plate 200 is changed as a result of an exposure operation, the temperature of the substrate 114 can be controlled with precision. Furthermore, by virtue of the above configuration, it is possible to prevent temperature variation, caused by radiation, on the members other than the substrate 114, such as a surface plate 206 opposed to the radiation plate 200, a coarse-adjustment guide 207 neighboring the coarse-adjustment actuator 205, and so forth.

<Third Embodiment>

FIG. 6 is a view showing a positioning apparatus according to the third embodiment.

The positioning apparatus 3 according to the third embodiment comprises, in the heat exchange portion, a radiation plate 200 opposed to the back surface of the top plate 111, and a radiation plate 300 opposed to the back surface of the chuck 113. The heat flowing to the substrate 114 (either a wafer or mask) and the heat generated in the chuck 113 are recovered through the radiation plate 300. A small amount of heat generated from the sensors, or the like, of the top plate 111 is recovered by the radiation plate 200.

The temperature rise of the positioning-target objects (substrate 114, electrostatic chuck 113, and top plate 111, and its accompanying members) is suppressed by these radiation plates 200 and 300. Similar to the black body 203 opposed to the radiation plate 200, a black body 303 is provided on the back surface of the chuck 113 opposed to the radiation plate 300. The radiation plates 200 and 300 are arranged respectively on the Peltier elements 201 and 301 on the cooling plates 202 and 302, which are supported by respective supporting members 211. In the third embodiment, the chuck 113 serves as the second structure. Since the bottom plate 110, coil 119, magnet 120, and so forth, are basically the same as that of the first embodiment, redundant descriptions will not be provided.

In the positioning apparatus 3, a part of the top plate 111 has a hole H. If the hole H cannot be provided in the top plate 111 because of the rigidity of the top plate 111, it may be constructed such that at least a part of the top plate 111 is formed with a material that transmits an infrared ray.

<Fourth Embodiment>

Figure 7:
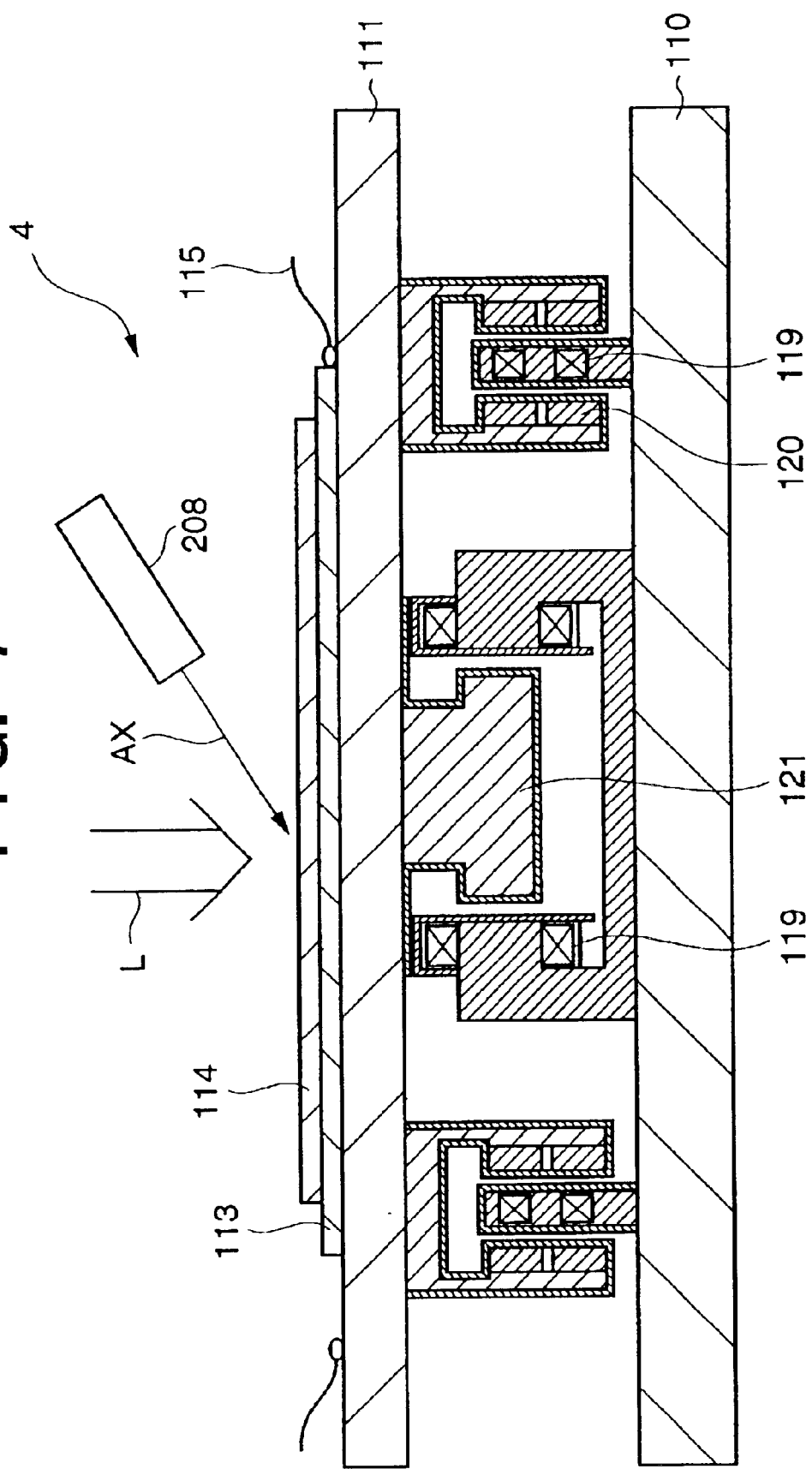
FIG. 7 is a view showing a structure of a positioning apparatus in a case where laser cooling is employed by the positioning apparatus of the fourth embodiment of the present invention.

FIG. 7 shows a positioning apparatus according to the fourth embodiment.

Note that components identical to or corresponding to those of the embodiment shown in FIG. 1 are referred to by the same reference numerals.

The positioning apparatus 4, adopting laser cooling for a non-contact heat controller, comprises a laser cooling apparatus 208, which constitutes a temperature adjusting mechanism.

In general, irradiation of an oscillation wavelength variable laser to a low-frequency side of a resonance absorption area of an atom gives a vibration that cancels atomic movement of a target object. Therefore, this can achieve a cooling effect. On the contrary, irradiating a high-frequency side enhances the atomic movement, and thus can achieve a heating effect. Descriptions of the detailed theory are left to the literature, such as the Journal of the Physical Society of Japan, vol. 43, No. 7, 1988, and so on.

With the use of this technique, irradiation of a cooling laser beam in accordance with a constituent material can cool the target object.

The positioning apparatus 4 of the fourth embodiment employing the foregoing nature irradiates a cooling laser beam from the laser cooling apparatus 208, which performs appropriate laser oscillation to the substrate 114 by canting a laser beam axle AX, to suppress a temperature rise caused by heat due to an exposure operation. The cooling laser beam is irradiated particularly to the portion, where the exposure light L is irradiated on the substrate 114 or the peripheral area of this portion. Accordingly, the temperature rise due to heat can quickly be suppressed, and effects of the temperature rise imposed on the peripheral members can be repressed.

<Embodiment of A Semiconductor Production System>

Next, a description is provided of an example of a production system of a semiconductor device (e.g., a semiconductor chip such as an IC or LSI, a liquid crystal panel, a CCD, a thin-film magnetic head, a micromachine, and so on), which employs an exposure apparatus comprising the positioning apparatus according to the present invention.

According to this embodiment trouble-shooting or periodic maintenance of a manufacturing machine installed in a semiconductor manufacturing factory, or maintenance service such as supplying software are performed by using a computer network outside the factory.

Figure 8:
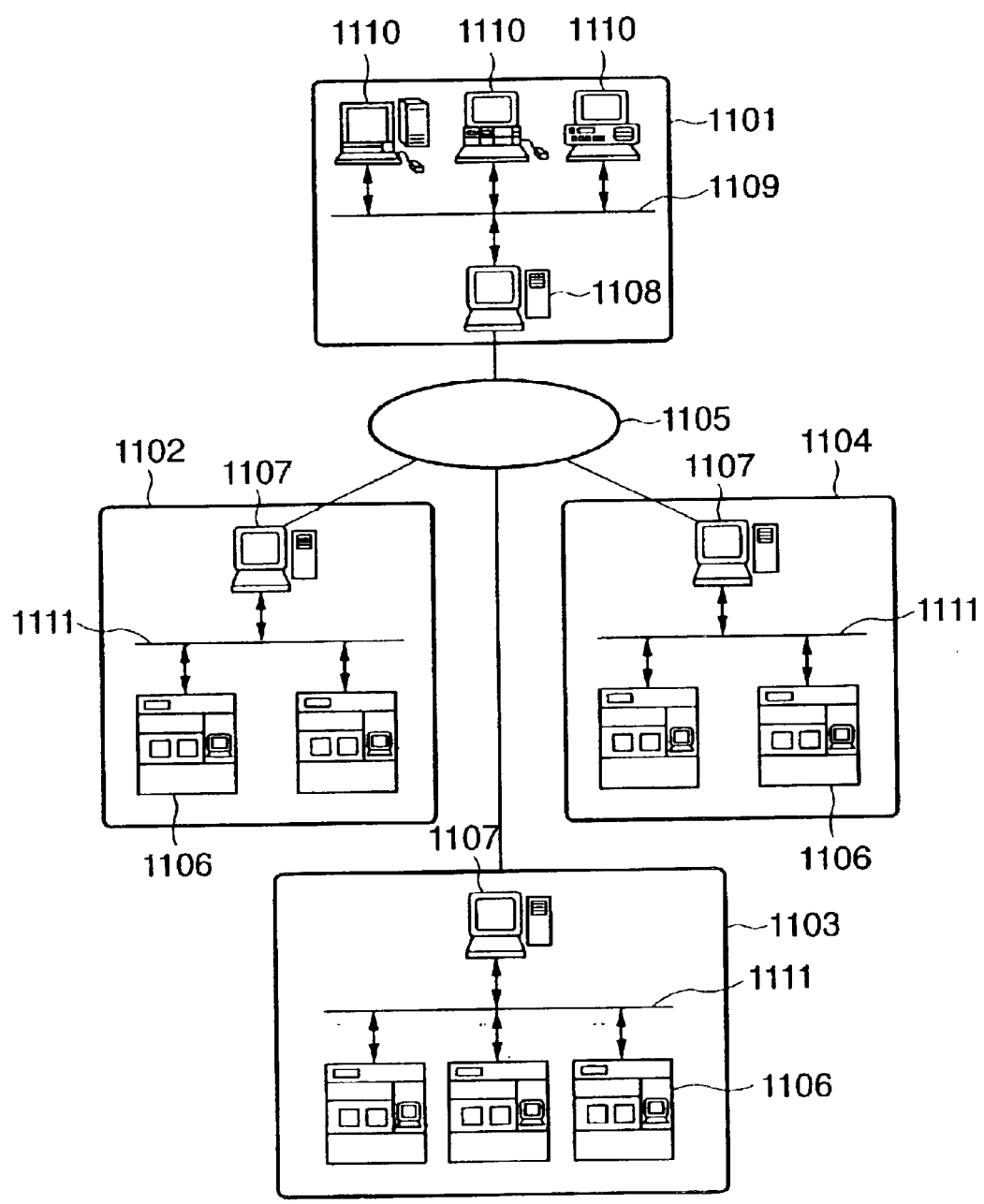
FIG. 8 is a conceptual view of a semiconductor device production system seen from one angle, which employs the positioning apparatus according to the present invention.

FIG. 8 shows an entire semiconductor device production system seen from one angle. Reference numeral 1101 denotes an office of a vendor (supplier) supplying semiconductor device manufacturing machines. Examples of the machines are semiconductor manufacturing machines for performing various processes in a semiconductor manufacturing factory, such as pre-process devices (e.g., an exposure apparatus, resist processors, a lithography device such as an etching device, a heat processor, a deposition device, a planarization device, and so on) and post-process devices (e.g., an assembling device, an inspection device, and so on).

The office 1101 includes a host management system 1108 for providing a maintenance database of the manufacturing machines, plural operation terminal computers 1110, and a local area network (LAN) 1109, which constructs an intranet by connecting the aforementioned computers. The host management system 1108 includes a gateway to connect the LAN 1109 with an external network, i.e., Internet 1105, and a security function which limits external access.

Meanwhile, reference numerals 1102 to 1104 denote factories of a semiconductor manufacturer, namely, a user of the manufacturing machines. The manufacturing factories 1102 to 1104 may belong to different manufacturers, or a single manufacturer (e.g., a factory for pre-processes and a factory for post-processes). Each of the factories 1102 to 1104 includes a plurality of manufacturing machines 1106, a local area network (LAN) 1111, which constructs an intranet by connecting the machines 1106, and a host management system 1107-serving as a monitoring apparatus to monitor an operation condition of each manufacturing machine 1106.

The host management system 1107 provided in each of the factories 1102 to 1104 includes a gateway to connect the LAN 1111 of each factory with an external network, i.e., Internet 1105. By virtue of the above construction, access to the host management system 1108 of the vendor 1101 is possible from the LAN 1111 of each factory via the Internet 1105. An access to the host management system 1108 is allowed only to limited users permitted by the security function.

More specifically, status information indicative of an operation condition of each manufacturing machine 1106 (e.g., a symptom of a troubled apparatus) is notified from the factory to the vendor through the Internet 1105, and a response to the notification (e.g., an instruction to cope with the trouble, or software and data for trouble-shooting) or maintenance information, such as the latest software or help information, is transmitted from the vendor to the factory.

A communication protocol (TCP/IP) generally used in the Internet is adopted for the data communication between each of the factories 1102 to 1104 and vendor 1101, and for data communication within each factory through the LAN 1111.

In place of the Internet serving as an external network of the factory, a high-security leased-line network (e.g., an ISDN, or the like) that does not allow access of a third party may be used. Furthermore, the host management system is not limited to the one provided by a vendor. A database constructed by a user may be provided to an external network to allow access from the user's plural factories.

Figure 9:
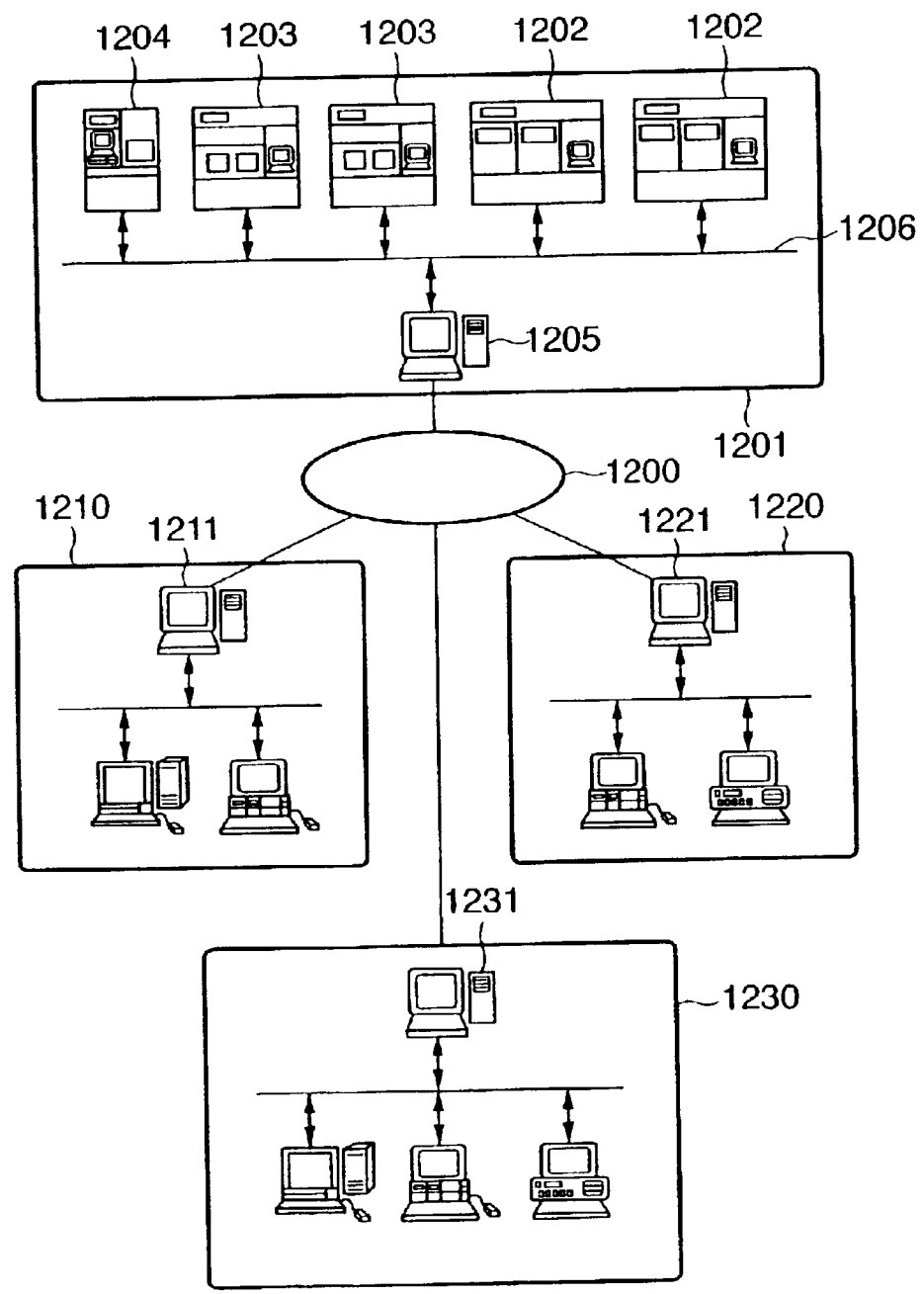
FIG. 9 is a conceptual view of a semiconductor device production system seen from another angle, which employs the positioning apparatus according to the present invention.

FIG. 9 shows an entire semiconductor device production system seen from an angle different from that of FIG. 8.

In the above example, plural user factories each having manufacturing machines are connected with the management system of the vendor through an external network, to communicate information regarding production management in each factory or information about at least one of the manufacturing machines. On the contrary, in the example shown in FIG. 9, a factory having manufacturing machines of plural different vendors is connected with management systems of respective vendors of the plural manufacturing machines through an external network to communicate maintenance information of each manufacturing machine.

In FIG. 9, reference numeral 1201 denotes a manufacturing factory (e.g., a semiconductor device manufacturer), namely, a user of the manufacturing machines. Provided in the production line of the factory is the manufacturing machines for performing various processes, for example, an exposure apparatus 1202, a resist processor 1203, and a deposition device 1204. Note that although FIG. 9 shows only one factory 1201, in reality, plural factories are connected through the network. Each of the machines in the factory is connected by a LAN 1206, thereby constructing an intranet. A host management system 1205, controls an operation condition of the production line.

Meanwhile, offices of the respective vendors, e.g., exposure apparatus manufacturer 1210, resist processor manufacturer 1220, and deposition device manufacturer 1230, comprise host management systems 1211, 1221, and 1231, respectively, to perform remote maintenance of the respective machines provided. Each host management system has a maintenance database and a gateway to the external network as mentioned above. The host management system 1205, which manages each machine of the user's factory, is connected with the management systems 1211, 1221, and 1231 of the respective vendors through an external network 1200, i.e., the Internet, or a leased-line network.

If trouble occurs in one of the series of manufacturing machines in the production line, operation of the production line is halted. However, the trouble may quickly be handled by receiving remote maintenance from the vendor of the machine having trouble through the Internet 1200. Accordingly, the halt of the production line can be minimized.

Each manufacturing machine installed in a semiconductor manufacturing factory comprises a display monitor, a network interface, software stored in a storage device for accessing a network, and a computer for executing the software to operate the machine. For the storage device, a built-in memory, hard disk, or network file server may be used.

The software for accessing a network includes a multi-purpose or exclusive web browser. Such software provide a user interface, such as that shown in FIG. 10, on the display monitor. With the use of this interface, an operator managing the manufacturing machines in each factory inputs information, e.g a model 1401 of the manufacturing machine, a serial number 1402, a title of the trouble 1403, data 1404, a level of urgency 1405, a symptom 1406, a trouble-shooting method 1407, a follow-up 1408, and so on, in the respective areas of the screen. The inputted information is transmitted to the maintenance database through the Internet, and in response, appropriate maintenance information is returned from the maintenance database and displayed on the monitor.

Moreover, the user interface provided by the web browser realizes hyperlink functions 1410 to 1412 shown in FIG. 10. An operator can access more detailed information of each item, download the latest version of software for the manufacturing machine from a software library provided by the vendor, or pull up an operation guide (help information) as a reference for a factory operator.

Herein, the maintenance information provided by the maintenance database includes information related to the present invention described above. In addition, the software library provides the latest software for realizing the present invention.

Figure 11:
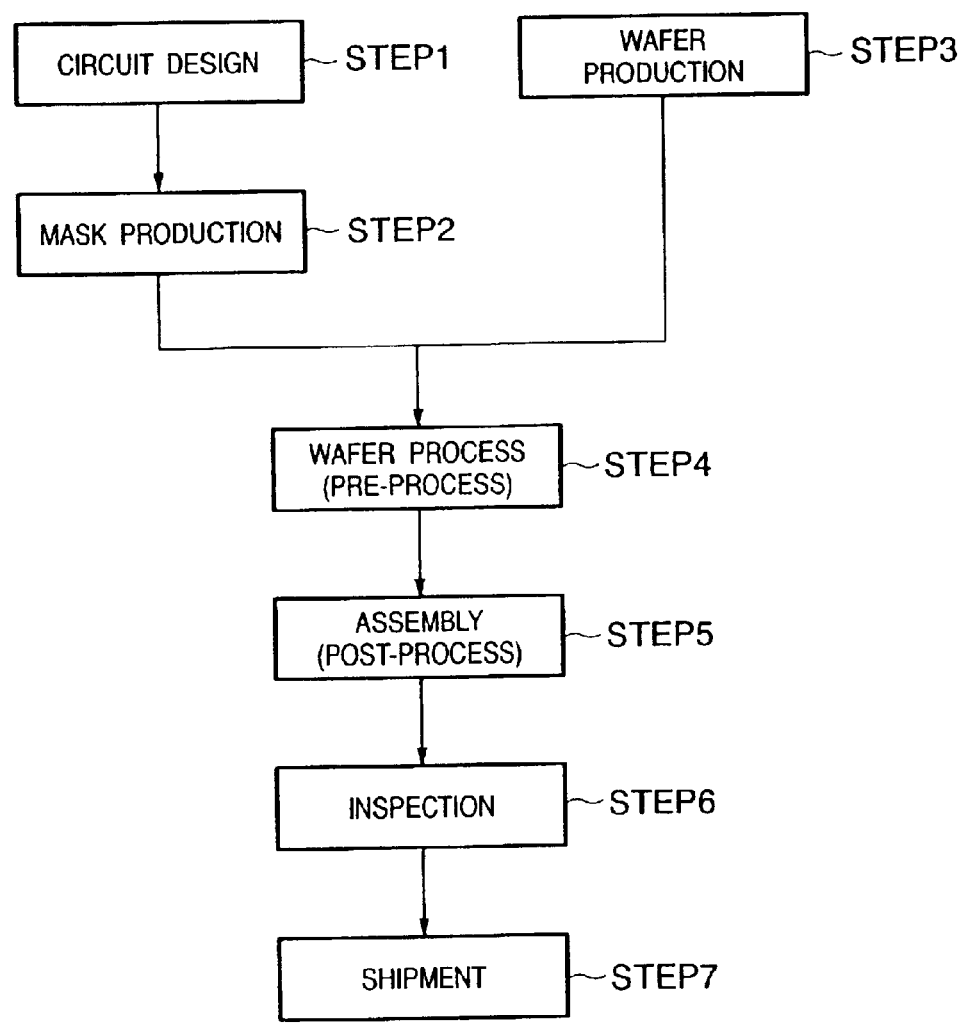
FIG. 11 is a flowchart explaining a device manufacturing process.

Next, a description is provided of a process of manufacturing a semiconductor device, utilizing the above-described production system. FIG. 11 shows a flow of an overall semiconductor device manufacturing process. In step SI (circuit design), a circuit of a semiconductor device is designed. In step S2 (mask production), a mask on which the designed circuit pattern is formed is produced. In step S3 (wafer production), a wafer is produced with a material such as silicon. In step S4 (wafer process), which is called a pre-process, an actual circuit is formed on the wafer with the use of the mask and wafer by a lithography technique. In step S5 (assembly), which is called a post-process, a semiconductor chip is produced by using the wafer produced in step S4. Step S5 includes an assembling process (dicing, bonding), a packaging process (chip embedding), and so on.

In step S6 (inspection), the semiconductor device manufactured in step S5 is subjected to inspection such as an operation-check test, a durability test, and so on. The semiconductor device manufactured in the foregoing processes is shipped (step S7). The pre-process and post-process are performed in different dedicated factories. Each of these factories can receive maintenance services of the above-described remote maintenance system. Among these pre-process factories and post-process factories, information related to production management or machine maintenance is communicated through the Internet or the leased-line network.

Figure 12:
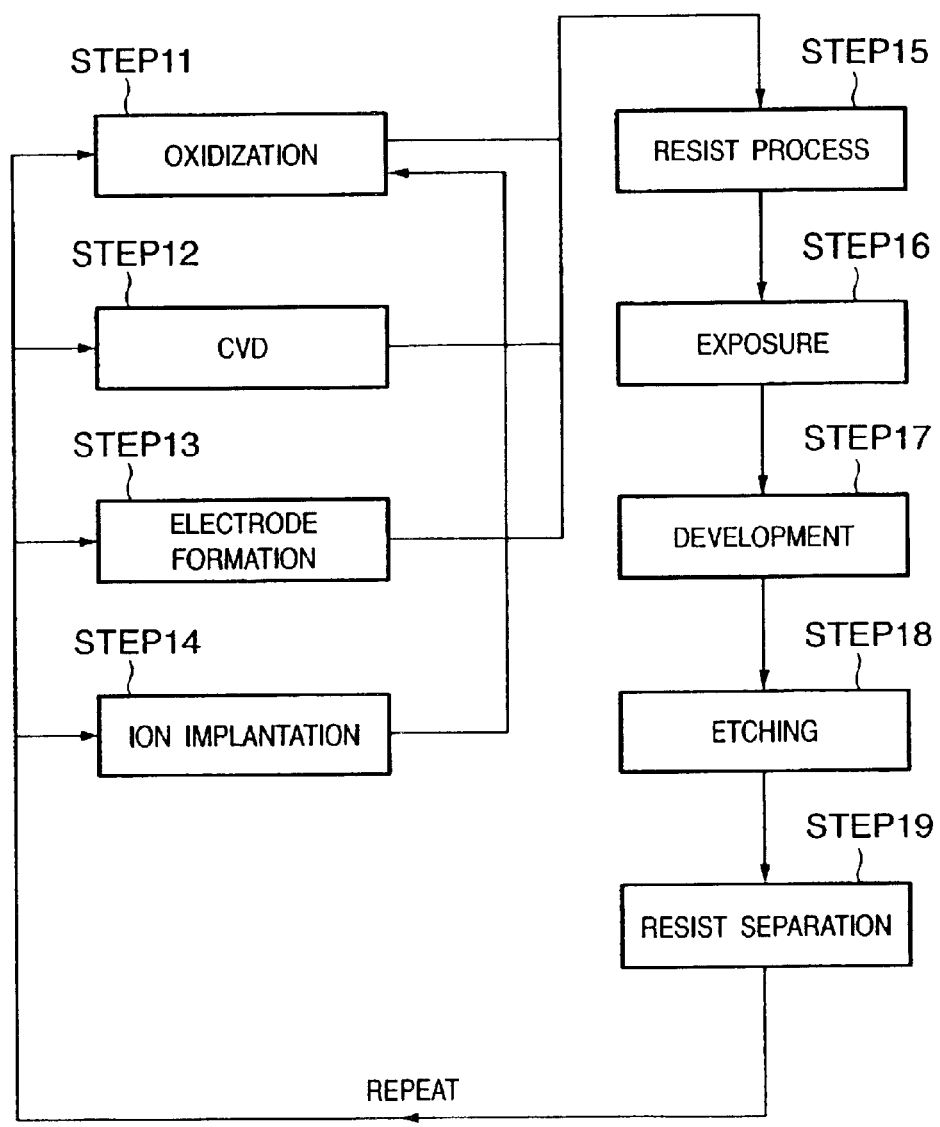
FIG. 12 is an explanatory view of a wafer process.

FIG. 12 shows a flow of the aforementioned wafer process in detail. In step S11 (oxidization), the wafer surface is oxidized. In step S12 (CVD), an insulating film is deposited on the wafer surface. In step S13 (electrode formation), an electrode is deposited on the wafer. In step S14 (ion implantation), ions are implanted on the wafer. In step S15 (resist process), a photosensitive agent is coated on the wafer. In step S16 (exposure), the circuit pattern on the mask is exposed and printed on the wafer by the above-described exposure apparatus. In step S17 (development) the exposed wafer is developed.

In step S18 (etching), portions other than the developed resist image are removed. In step S19 (resist separation), unnecessary resist after the etching process is removed. By repeating the foregoing steps, multiple circuit patterns are formed on the wafer. The manufacturing machine employed in each of the above steps is maintained by the aforementioned remote maintenance system. Therefore, trouble can be prevented before it occurs, and even if trouble occurs, quick recovery is possible. Accordingly, the productivity of a semiconductor device can be improved compared to a conventional level.

According to the positioning apparatus of the present invention, it is possible to perform temperature control of a positioning-target object without deteriorating a vibration isolation characteristic. The empty weight compensation of the positioning apparatus can be realized without any contact by utilizing a magnetic force or a Lorentz force, and the vibration isolation characteristic can further be improved.

The non-contact heat controller can readily be achieved by utilizing radiation or laser cooling. The radiation plate and the portion where the radiation temperature control is operated are formed with a surface having a high emissivity to enhance efficiency of the radiation temperature control. On the contrary, the portion where the radiation temperature control is not operated is formed with a surface having a low emissivity to suppress an effect of the radiation plate's temperature. Accordingly, unpredictable heat transfer is eliminated, and efficiency of the temperature control is improved.

The present invention is effective not only for a substrate and its accompanying members, but also for an optical system, which necessitates precise positioning, particularly, a mirror, or the like.

Arranging the radiation plate opposed to a temperature-control object improves radiation efficiency. Moreover, performing temperature control of the radiation plate with a Peltier element or heat pipe, and cooling the heat exhaust side of the Peltier element with a refrigerant achieves efficient heat recovery. Furthermore, setting a temperature of the refrigerant to approximately the same level as that of an atmospheric temperature can prevent the coolant temperature from giving a negative effect on other members.

In a case wherein a positioning-target object largely moves, the radiation plate is divided into plural areas to enable independent control of the radiation amount in each area in accordance with the relative positional relation between the positioning-target object and radiation plate. Accordingly, radiation temperature control can be performed only on the positioning-target object with precision, and an influence on portions other than the positioning-target object can be eliminated.

Constructing an exposure apparatus with the above-described positioning apparatus can achieve a superior exposure performance to conventional performance. Furthermore, adjusting the radiation amount of the radiation plate based on a signal of the central control device controlling the exposure operation can realize highly accurate temperature control with an excellent response.

Moreover, the device manufacturing method and apparatus according to the present invention can stably supply high-precision devices at a low cost.

The present invention is not limited to the above embodiments and various changes and modifications can be made within the spirit and scope of the present invention. Therefore, to apprise the public of the scope of the present invention, the following claims are made.

What is claimed is:

1. A positioning apparatus for performing positioning of a target object in a vacuum atmosphere, said apparatus comprising:
    a first structure;
    a second structure which is movable relative to said first structure and supports the target object;
    a driving device which drives said second structure without contact;
    a supporting device which supports said second structure for said first structure without contact;
    a radiation plate, which is arranged on said first structure, performing heat exchange between said radiation plate and said second structure by utilizing radiation; and
    a temperature adjusting device which adjusts temperature of said radiation plate, in order to control temperature of one of said second structure and said target object.

2. The positioning apparatus according to claim 1, wherein said temperature adjusting device comprises a Peltier element absorbing heat of said radiation plate.

3. The positioning apparatus according to claim 1, wherein said first structure is movable.

4. The positioning apparatus according to claim 1, wherein said supporting device supports said second structure by using electromagnetic force.

5. The positioning apparatus according to claim 1, wherein said second structure is supported for said first structure without a guide.

6. The positioning apparatus according to claim 1, wherein said radiation plate and said second structure comprise a black body portion arranged at a surface opposed to each other.

7. The positioning apparatus according to claim 1, wherein said radiation plate and said second structure comprise as, at least one of its surfaces, at least one of resin, glass and a layer of oxides.

8. The positioning apparatus according to claim 1, wherein said radiation plate is divided into a plurality of areas.

9. The positioning apparatus according to claim 1, further comprising a temperature measurement portion which measures temperature of the target object subjected to positioning.

10. The positioning apparatus according to claim 1, wherein at least one of said first structure and said second structure is made of ceramics.

11. The positioning apparatus according to claim 1, wherein said second structure is one of a chuck supporting the target object and a top plate supporting the chuck.

12. The positioning apparatus according to claim 1, wherein the target object subjected to positioning is a temperature-control subject, wherein a portion subjected to temperature control is formed with a material having a high emissivity and a portion not subjected to temperature control is formed with a material having a low emissivity.

13. An exposure apparatus comprising the positioning apparatus according to claim 1.

14. The positioning apparatus according to claim 1, further comprising a temperature measurement portion which measures a temperature of said second structure,
    wherein said temperature adjusting device comprises a Peltier element and adjusts an amount of electrification to the Peltier element on the basis of an output of said temperature measurement portion.

15. The positioning apparatus according to claim 1, further comprising a temperature estimation device which estimates a temperature of said second structure, wherein said temperature adjusting device comprises a Peltier element and adjusts an amount of electrification to the Peltier element on the basis of an estimation value of said temperature estimation device.

16. A positioning apparatus for performing positioning of a target object in a vacuum atmosphere, said apparatus comprising:

a first structure;

a second structure which is movable relative to said first structure and supports the target object;

a radiation plate, which is arranged on said first structure, performing heat exchange between said radiation plate and said second structure by utilizing radiation;

driving means, which is arranged on said first structure, for driving said second structure; and suppressing means for suppressing radiation heat flowing from a heat source of said driving means to first structure.

17. A positioning apparatus for performing positioning of a target object in a vacuum atmosphere, said apparatus comprising:

a first structure which is movable;

a second structure which is movable relative to said first structure and supports the target object;

a driving device which drives said second structure without contact;

a supporting device which supports said second structure for said first structure without contact; and a radiation plate, which is arranged on said first structure, performing heat exchange between said radiation plate and said second structure by utilizing radiation.

* * * * *

UNITED STATES PATENT AND TRADEMARK OFFICE
CERTIFICATE OF CORRECTION

PATENT NO. : 6,954,258 B2
DATED : October 11, 2005
INVENTOR(S) : Keiji Emoto

It is certified that error appears in the above-identified patent and that said Letters Patent is hereby corrected as shown below:

<u>Title page,</u>
Item [56], References Cited, FOREIGN PATENT DOCUMENTS, "JP   9092613   *   4/1997" should read -- JP   9-092613   *   4/1997 --.

<u>Column 1,</u>
Line 18, "lorentz" should read -- Lorentz --.

<u>Column 3,</u>
Line 46, "of, the" should read -- of the --.
Line 51, "structure)." should read -- structure) --.

<u>Column 4,</u>
Line 10, "For," should read -- For --.
Line 19, "plate 10" should read -- plate 110 -- and "plate 11" should read -- plate 111 --.
Line 36, "plate 10" should read -- plate 110 --.
Line 64, "plate 11" should read -- plate 111 --.

<u>Column 6,</u>
Line 61, "114" should read -- 114, --.

<u>Column 7,</u>
Line 34, "sensors;" should read -- sensors, --.

UNITED STATES PATENT AND TRADEMARK OFFICE
CERTIFICATE OF CORRECTION

PATENT NO. : 6,954,258 B2
DATED : October 11, 2005
INVENTOR(S) : Keiji Emoto

It is certified that error appears in the above-identified patent and that said Letters Patent is hereby corrected as shown below:

Column 8,
Line 29, "embodiment" should read -- embodiment, --.
Line 62, "1107-serving" should read -- 1107 serving --.

Column 10,
Line 13, "e.g" should read -- e.g., --.

Column 14,
Line 2, "to first" should read -- to said first --.

Signed and Sealed this

Fourteenth Day of March, 2006

JON W. DUDAS
*Director of the United States Patent and Trademark Office*